United States Patent
Zeng et al.

(10) Patent No.: US 8,443,257 B1
(45) Date of Patent: May 14, 2013

(54) RATE-SCALABLE, MULTISTAGE QUASI-CYCLIC LDPC CODING

(75) Inventors: Lingqi Zeng, San Jose, CA (US); Yu Kou, San Jose, CA (US); Kin Man Ng, Cupertino, CA (US); Kwok W. Yeung, Milpitas, CA (US)

(73) Assignee: SK hynix memory solutions inc., San Jose, CA (US)

( * ) Notice: Subject to any disclaimer, the term of this patent is extended or adjusted under 35 U.S.C. 154(b) by 261 days.

(21) Appl. No.: 13/039,068

(22) Filed: Mar. 2, 2011

Related U.S. Application Data

(63) Continuation-in-part of application No. 12/970,731, filed on Dec. 16, 2010.

(60) Provisional application No. 61/339,564, filed on Mar. 4, 2010, provisional application No. 61/330,627, filed on May 3, 2010, provisional application No. 61/337,287, filed on Feb. 1, 2010.

(51) Int. Cl.
*H03M 13/00* (2006.01)

(52) U.S. Cl.
USPC .......................... 714/758; 714/779

(58) Field of Classification Search .......... 714/779, 714/758
See application file for complete search history.

(56) References Cited

U.S. PATENT DOCUMENTS

| | | | |
|---|---|---|---|
| 5,905,666 A | 5/1999 | Hoffman et al. | |
| 6,757,122 B1 * | 6/2004 | Kuznetsov et al. | 360/53 |
| 7,962,828 B2 | 6/2011 | Kyung et al. | |
| 8,095,859 B1 * | 1/2012 | Peterson et al. | 714/801 |
| 8,196,010 B1 | 6/2012 | Gunnam et al. | |
| 8,255,764 B1 | 8/2012 | Yeo et al. | |
| 8,255,765 B1 | 8/2012 | Yeo et al. | |
| 8,347,190 B2 | 1/2013 | Brauchle et al. | |
| 8,359,515 B2 | 1/2013 | Gunnam | |
| 2002/0188906 A1 | 12/2002 | Kurtas et al. | |
| 2008/0052594 A1 | 2/2008 | Yedidia et al. | |
| 2008/0126908 A1 * | 5/2008 | Lin | 714/758 |
| 2008/0163027 A1 | 7/2008 | Richardson et al. | |
| 2008/0276156 A1 | 11/2008 | Gunnam et al. | |
| 2008/0301521 A1 | 12/2008 | Gunnam et al. | |
| 2009/0138785 A1 | 5/2009 | Sakai et al. | |
| 2009/0150746 A1 | 6/2009 | Chaichanavong et al. | |
| 2009/0327847 A1 * | 12/2009 | Shen et al. | 714/804 |
| 2010/0023838 A1 | 1/2010 | Shen et al. | |
| 2010/0153819 A1 * | 6/2010 | Ueng et al. | 714/763 |

(Continued)

OTHER PUBLICATIONS

Li et al., "Efficient Encoding of Quasi-Cyclic Low-Density Parity-Check Codes," IEEE Transactions on Communications, vol. 54, No. 1, Jan. 2006.

*Primary Examiner* — M. Mujtaba K Chaudry
(74) *Attorney, Agent, or Firm* — Van Pelt, Yi & James LLP

(57) ABSTRACT

Encoding is performed by dividing a quasi-cyclic low-density parity-check (QC-LDPC) parity check matrix into a first sub-matrix and a second sub-matrix. The first sub-matrix includes a plurality of circulant vectors and the plurality of circulant vectors is associated with a circulant size. Input data is received having a length which is a product of an integer multiplier and the circulant size. A first stage of multi-stage LDPC encoding is performed using the input data and a subset of the plurality of circulant vectors; the number of circulant vectors in the subset equals the integer multiplier.

24 Claims, 13 Drawing Sheets

U.S. PATENT DOCUMENTS

2010/0162074 A1 6/2010 Oh et al.
2010/0169736 A1 7/2010 Garani
2010/0257425 A1* 10/2010 Yue et al. ................... 714/752
2012/0221913 A1 8/2012 Anholt et al.

* cited by examiner $$H_{QC\text{-}LDPC} = \begin{bmatrix} \overbrace{\begin{array}{cccc} A_{0,0} & A_{0,1} & A_{0,2} & A_{0,3} \\ A_{1,0} & A_{1,1} & A_{1,2} & A_{1,3} \\ A_{2,0} & A_{2,1} & A_{2,2} & A_{2,3} \end{array}}^{\text{Sub-matrix } H_i \ (802)} & \overbrace{\begin{array}{ccc} A_{0,4} & A_{0,5} & A_{0,6} \\ A_{1,4} & A_{1,5} & A_{1,6} \\ A_{2,4} & A_{2,5} & A_{2,6} \end{array}}^{\text{Sub-matrix } H_p \ (804)} \end{bmatrix}$$

$n = 7b$, $m = 3b$, 800

$$H_i = \begin{bmatrix} A_{0,0} & A_{0,1} & A_{0,2} & A_{0,3} \\ A_{1,0} & A_{1,1} & A_{1,2} & A_{1,3} \\ A_{2,0} & A_{2,1} & A_{2,2} & A_{2,3} \end{bmatrix}$$

RATE-SCALABLE, MULTISTAGE QUASI-CYCLIC LDPC CODING

CROSS REFERENCE TO OTHER APPLICATIONS

This application is a continuation in part of co-pending U.S. patent application Ser. No. 12/970,731 entitled MULTI-STAGE LDPC ENCODING filed Dec. 16, 2010, which is incorporated herein by reference for all purposes, which claims priority to U.S. Provisional Patent Application No. 61/337,287 entitled EFFICIENT ENCODING OF A GENERAL LDPC CODE filed Feb. 1, 2010, which is incorporated herein by reference for all purposes; this application also claims priority to U.S. Provisional Patent Application No. 61/339,564 entitled QUASI-CYCLIC LOW-DENSITY-PARTY-CHECK CODES ENCODING filed Mar. 4, 2010 which is incorporated herein by reference for all purposes and U.S. Provisional Patent Application No. 61/330,627 entitled LDPC ENCODER AND DECODER filed May 3, 2010 which is incorporated herein by reference for all purposes.

BACKGROUND OF THE INVENTION

Multistage quasi-cyclic low-density parity-check (QC-LDPC) encoders perform LDPC encoding in multiple stages. In some applications they may be attractive compared to single-stage encoders because multi-stage encoders may perform fewer matrix operations and/or at least some of the multi-stage circuitry is reused, thus enabling a smaller device than a single stage encoder. It would be desirable if these multistage encoders could be further improved upon, for example, to be able to handle different amounts of input data to encode (e.g., on-the-fly and/or without having to unload an inappropriately-sized code and load a more appropriately-sized one onto the system).

BRIEF DESCRIPTION OF THE DRAWINGS

Various embodiments of the invention are disclosed in the following detailed description and the accompanying drawings.

FIG. 8 is a diagram showing an embodiment of a QC-LDPC parity check matrix, which includes sub-matrix $H_i$ which comprises columns of circulants.

DETAILED DESCRIPTION

Figure 1:
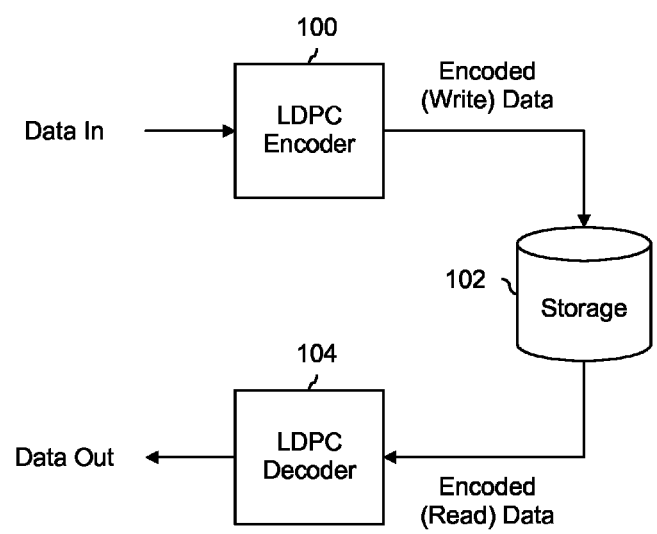
FIG. 1 is a diagram showing an embodiment of a system configured to encode and store data using a low-density parity-check (LDPC) code.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

What is described herein is a multistage quasi-cyclic (QC-LDPC) coding system which is rate scalable. In multistage coding, the coding is performed in multiple stages, for example by breaking a parity check matrix into multiple, component matrices and performing multiple matrix operations using the component matrices. These matrix operations are performed in a prescribed or specified sequence and the first matrix operation may be expecting or configured to process a certain amount of input data. The technique described herein permits multistate systems to process various amounts of input data, thus enabling a rate scalable system. In one example, a coding system is a configurable or programmable one where a specified or desired code is loaded into memory (e.g., from some external source via an I/O interface or retrieved from storage) and the system is rate scalable without unloaded the code from memory. Unloading/loading a code may be time consuming and it may be desirable to be able to adjust the coding rate and/or adapt to various amount of input data to encode without loading a new code. First, multistage systems in general will be described. Then, embodiments of multistage systems which are rate scalable are described. Finally, some storage-efficient techniques to store generator matrices and/or parity check matrices are described.

Multistage LDPC Encoders and Decoders

FIG. 1 is a diagram showing an embodiment of a system configured to encode and store data using a low-density parity-check (LDPC) code. In the example shown, LDPC encoder 100 receives data in and includes (or is based on) data which is desired to be stored. In some embodiments, multiple layers of coding are performed and the data received is already encoded (e.g., with another type of code such as a Reed Solomon code). Similarly, after encoding by LDPC encoder 100, in some embodiments another layer of encoding is performed.

In the example shown, encoded write data is output by LDPC encoder 100; this data is stored in storage 102. In various embodiments, storage 102 includes a variety of storage types or media such as (e.g., magnetic) disk drive storage, Flash storage, etc. When the stored data is requested or otherwise desired (e.g., by an application or user that stored the data), LDPC decoder 104 accesses storage 102 and retrieves encoded read data, along with some noise or errors. LDPC decoding is performed on the read-back data by decoder 104 and data out is passed to the appropriate entity (e.g., the user or application which requested it). With proper encoding and decoding, the data in matches the data out.

In LDPC coding, the code is defined by or otherwise characterized by a parity check matrix (H). H is a matrix of size m×n, which is also an rr×cc array of q×q circulants (i.e., rr*q=m and cc*q=n). From the parity check matrix, a second matrix (G), referred to herein as the generator matrix, is generated. For cases where the parity check matrix (H) is a full rank matrix, the generator matrix (G) has dimension of (n−m)×n. A full rank parity check matrix H is one where all rows in the matrix are linearly independent of all other rows. The generator matrix (G) is used to generate encoded data from the input data. For example, if the input data is represented as u, a 1×(n−m) matrix, and the encoded write data is represented as c (a 1×n matrix) then c=u*G, where "*" is a matrix multiplication. In some cases, the generator matrix (G) is manipulated to be in a special form (i.e., a systematic matrix) where G=[I P] and I is the identity matrix and P is a parity generator matrix. In systematic form, the encoded data (c) includes the input data (u) in its original form. In one example, the encoded data may be the input data (u) followed by the parity bits. Parity data (p) may be obtained from u*P and when combined with the input data generates the codeword (i.e., the encoded data).

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

What is described below is a multistage (e.g., two-stage) LDPC encoder where the parity check matrix (H) is broken down into two or more sub-matrices and encoding is done in two or more stages using the sub-matrices and the transformation (i.e., inversion) of the sub-matrices. The following figures describe some embodiments of such a multistage LDPC encoder.

Figure 2A:
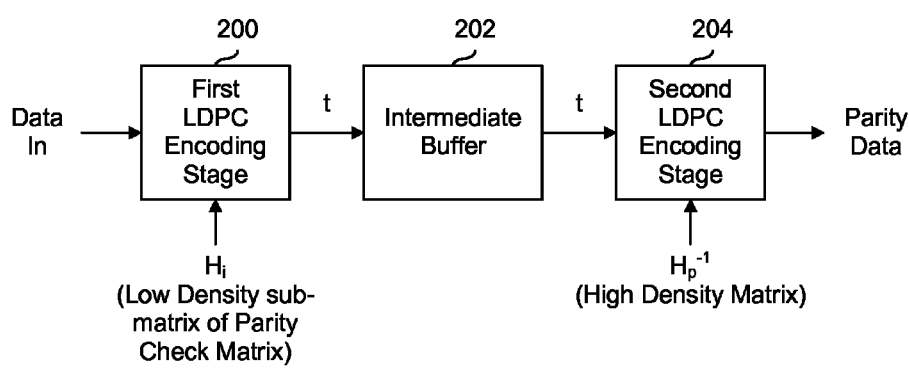
FIG. 2A is a diagram showing an embodiment of a two stage LDPC encoder.

FIG. 2A is a diagram showing an embodiment of a two stage LDPC encoder. In the example shown, a parity check matrix H (not shown) is broken down into two sub-matrices: a m×(n−m) sub-matrix $H_i$ and a m×m sub-matrix $H_p$. The inversion of the sub-matrix $H_p$ has the same size of m×m and is a relatively high density matrix (e.g., in one example the ratio of 1's to 0's is roughly 1 to 1), denoted by $H_p^{-1}$; the sub-matrix $H_i$ has a relatively low density (e.g., mostly 0's with relatively few 1's). $H_p$ is a low density matrix whereas the inversion of $H_p$ (i.e., $H_p^{-1}$ is high density. The size of the two sub-matrices varies depending upon the values of m and n; in some cases with exemplary and/or typical values for m and n (i.e., m<<n), the size of the sub-matrix $H_p$ and its inversion $H_p^{-1}$ is much smaller compared to the size of the sub-matrix $H_i$. In some embodiments, LDPC encoder 100 shown in FIG. 1 is implemented as shown in this figure.

The low density sub-matrix and a high density matrix $H_p^{-1}$ are passed to and used respectively by the first LDPC encoding stage (200) and the second LDPC encoding stage (204). The first encoding stage (200) performs the operation $u*H_i^T$ where u is the 1×(n−m) matrix of input data. $H_i^T$ is an (n−m)×m matrix so the matrix multiplication results in intermediate data (t) in the form of a 1×m matrix.

The intermediate data is passed to intermediate buffer 202 where it is stored. For example, second encoding stage 204 may be busy with other intermediate data (e.g., associated with earlier input data) and when second encoding stage 204 is free the stored intermediate data is retrieved from intermediate buffer 202. In some embodiments, intermediate buffer 202 includes 2 "ping pong" buffers or memories which switch off. For example, while intermediate data for a first (e.g., later arriving) set of input data is being generated by first encoding stage 200 and is being written to the first buffer, intermediate data associated with a second (e.g., earlier arriving) set of input data is being passed from the second buffer to the second encoding stage (204). Once the first buffer is full and the second buffer has been emptied, the two buffers switch off (i.e., the first buffer offloads its intermediate data to the second encoding stage while the second buffer receives intermediate data associated with a third (e.g., even later arriving) set of input data from the first encoding stage). In some embodiments, buffer 202 includes one or more FIFOs so that first encoding stage 200 and second encoding stage 204 do not need to deal with memory addresses when loading or unloading intermediate data (t).

Second encoding stage 204 performs the operation $t*(H_p^{-1})^T$ which produces parity data in the form of a 1×m matrix. By combining the parity data with the input data (e.g., via concatenation), LDPC encoded data in systematic form may be produced.

In some applications, a two-stage encoder is used in a disk drive storage system. In some such embodiments, encoding is performed by each stage in 1 sector time (i.e., the amount of time is takes to read 1 sector from the disk) or less and the latency (i.e., the amount of time from when the last input bit is received to when the last parity bit is output) is also 1 sector time. Some applications may care more about throughput compared to latency and a 1 sector latency may be acceptable.

Using a two-stage encoding technique as described herein may have a number of advantages. For example, using two stages may result in fewer actual operations being performed when generating encoded data. Also, using two-stage encoding technique requires much less memory storage. The following table shows operations and corresponding sizes of matrix multiplications that are performed.

TABLE 1

| | Operation | Size of matrix multiplication | Comments |
|---|---|---|---|
| Integrated (parity only) | p = u * P | (1 × (n − m)) * ((n − m) × m) | This operation generates the parity data only; G is a relatively high density matrix |

TABLE 1-continued

| Operation | | Size of matrix multiplication | Comments |
|---|---|---|---|
| Stage 1 | $t = u * H_i^T$ | $(1 \times (n-m)) *$ $((n-m) \times m)$ | $H_i$ is low density sub-matrix of parity check matrix |
| Stage 2 | $p = t * (H_p^{-1})^T$ | $(1 \times m) *$ $(m \times m)$ | This operation generates the parity data only; $H_p^{-1}$ is high density matrix |

In Table 1 shown above, the integrated technique is a straightforward process where the parity data (p) is generated by performing the operation u*P. The size of the matrix operation of the integrated technique is the same as the size of the matrix operation for the first encoding stage (i.e., a (1×(n−m))*((n−m)×m) matrix operation). Of those potential operations, the integrated approach has a higher percentage of potential operations which are "actual" operations (i.e., they are not zeroed out because of multiplication by 0). This is because the G matrix has a relatively high density (e.g., roughly the same number of 1's and 0's) whereas $H_i$ (and therefore $H_i^T$) has a relatively low density (e.g., few 1's and mostly 0's). A relatively high percentage of the multiplications for the first encoding stage will be zeroed out (because most of the values in the $H_i^T$ matrix are 0's) whereas the G matrix has a lower density of 0's and a lower percentage of operations will be zeroed out. Put another way, if the number of actual operations=α×(number of potential operations) where α is a scaling factor related to the density of a matrix (e.g., P or $H_i^T$) which ranges from 0 to 1, the value of α is lower for the first encoding stage (e.g., typically <0.05) compared to the integrated approach, typically ~0.5.

With respect to storage requirements, the integrated approach needs to store the high density matrix P of size (n−m)×m. Since the quasi-cyclic structure can help reduce the storage by a factor of q, the size of the circulant, the memory requirement for integrated approach is (n−m)×m/q bits. For two-stage encoding approach, $H_i^T$ required for first stage is not considered as an addition memory requirement for encoding because it is already stored for decoding purpose. So only $H_p^{-1}$ required for second stage encoding is considered as encoding memory storage, which is m×m/q bits. In storage application, the typical ratio of (n−m) and m is around 10. That is, with two-storage encoding approach, the memory saving is ~90%.

Since the matrix $H_p^{-1}$ is a high density matrix like P, the matrix multiplication for the second encoding stage shown in the table above has roughly the same scaling factor α as that of matrix multiplication in integrated approach. However, because n−m is typically (much) larger than m, the number of operations associated with the second encoding stage is much smaller than that of integrated approach. Because the two-stage encoding approach can pipeline the first stage and the second stage encoding, we have a sector time to do the second stage encoding. That is, the saving on the number of operations of the second stage encoding compared with that of the integrated approach can be directly translated into the saving on the hardware complexity by time-sharing the same hardware.

Figure 2B:
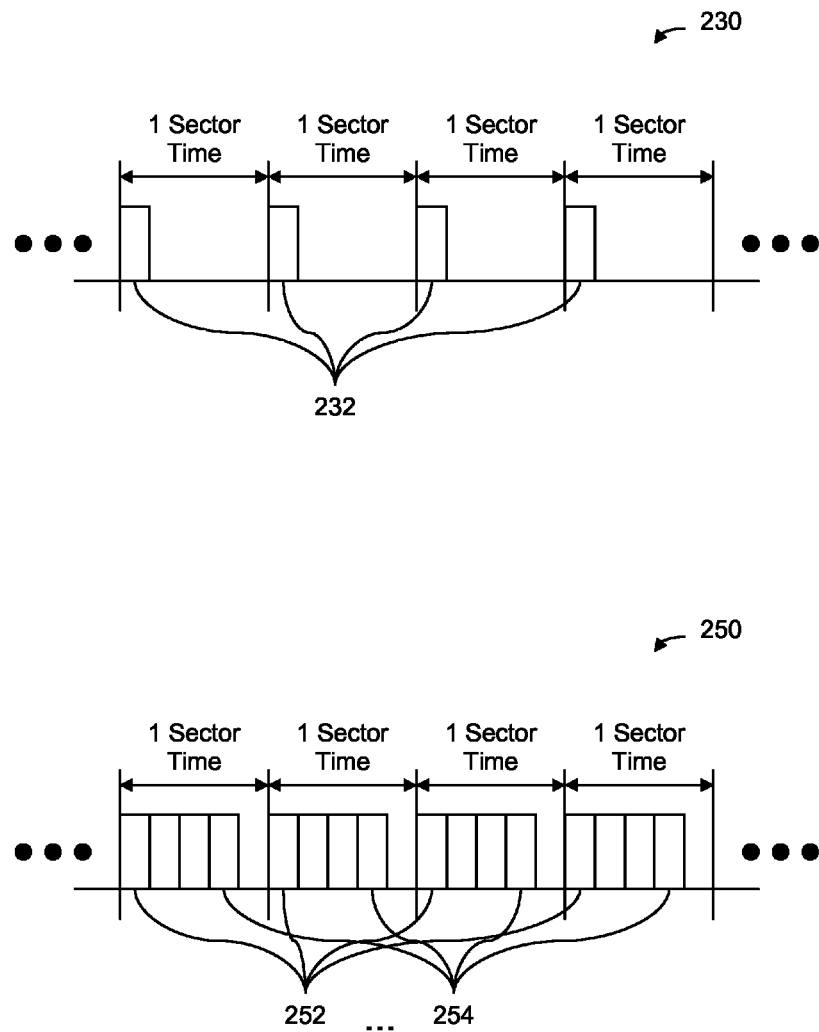
FIG. 2B is a diagram showing embodiments of timing diagrams corresponding to two different implementations of a second encoding stage of the two-stage approach.

FIG. 2B is a diagram showing embodiments of timing diagrams corresponding to two different implementations of a second encoding stage of the two-stage approach. In the example shown, timing diagram 230 corresponds to an encoding stage (e.g., a first or second encoding stage) where the encoding stage has all of the logic (e.g., multipliers and adders) needed to perform the encoding in a single operation. In the example shown, the system is a disk drive system and the desired completion time for the (e.g., first or second) encoding stage is a single sector time. Processing time 232 shows the portion of each sector time consumed in performing the encoding.

Timing diagram 250 shows a timing diagram corresponding to an encoding stage (e.g., a first or second encoding stage) where the data to be encoded is divided into multiple portions (in this example, 4 groups) and the logic (e.g., multipliers and adders) is reused. For example, the encoding stage corresponding to timing diagram 250 may have $\frac{1}{4}^{th}$ the amount of logic (e.g., multipliers and adders) compared to the encoding stage corresponding to timing diagram 230. Processing time 252 shows the time spent processing the first fourth of data to be encoded and processing time 252 shows the time spent processing the last fourth of data to be encoded. The total amount of processing time (i.e., to process all 4 groups) is still less than 1 sector time and the data is encoded in sufficient time (i.e., is encoded in less than 1 sector time) to meet desired system requirements.

In some applications, including less logic in a system and reusing the logic is desirable because the system is smaller and/or less expensive but still finishes encoding within a desired amount of time. Some example applications in which this may be desirable include price sensitive storage applications (e.g., ones in which consumers are very sensitive to the cost of the system and seek out low prices). For example, the cost to manufacture a ASIC increases with the amount of logic and thus reducing logic (e.g., multipliers and adders) correspondingly reduces manufacturing costs.

Figure 3:
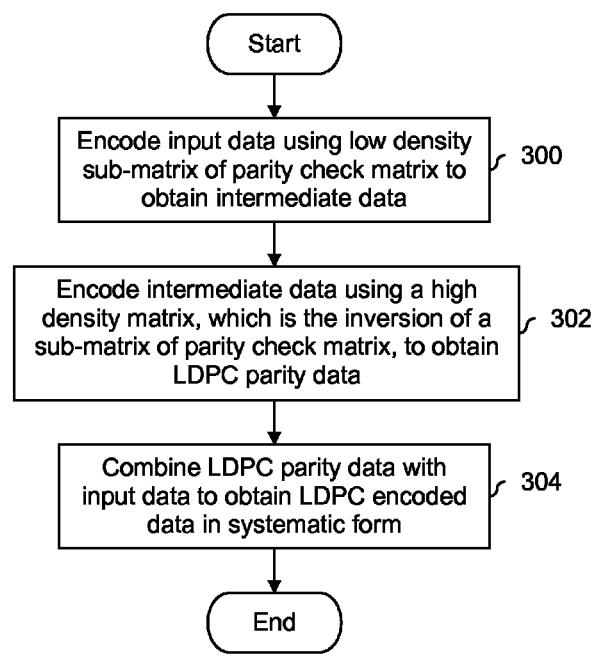
FIG. 3 is a flowchart illustrating an embodiment of a process for generating LDPC encoded data using a two stage encoder.

FIG. 3 is a flowchart illustrating an embodiment of a process for generating LDPC encoded data using a two stage encoder. In some embodiments, the process is performed using the system shown in FIG. 2A.

At 300, input data is encoded using a low density sub-matrix of a parity check matrix to obtain intermediate data. For example, the parity check matrix (H) is broken down into a m×(n−m) sub-matrix $H_i$ and a m×m submatrix $H_p$ and $H_i$ is input to a first encoding stage. In some embodiments, the and the inversion of $H_p$ are stored in memory and passed to the various stages when needed. Referring back to FIG. 2A, in some embodiments, step 300 is performed by first encoding stage 200.

Intermediate data is encoded using the inversion of the sub-matrix $H_p$ of a parity check matrix to obtain LDPC parity data at 302. In some embodiments, the intermediate data is stored in a buffer and step 302 includes retrieving the intermediate data from a buffer. Referring back to FIG. 2A, in some embodiments, step 302 is performed by second encoding stage 204.

At 304, the LDPC parity data is combined with the input data to obtain LDPC encoded data in systematic form. In one example, the parity data is appended to the end of the input data to obtained LDPC encoded data. In various embodiments, step 304 is performed by a variety of processors, either general purpose processors configured at least temporarily to perform the combination or specially designed components permanently so configured. With respect to FIG. 2A, there is no corresponding component in FIG. 2A which performs step 304.

The following figures show some examples of how the high density matrix ($H_p^{-1}$) and low density sub-matrix ($H_i$) are obtained from a parity check matrix. First, a process for obtaining $H_p^{-1}$ and $H_i$ is described. Then, an exemplary parity check matrix is described and the processing is explained using the exemplary parity check matrix.

Figure 4:
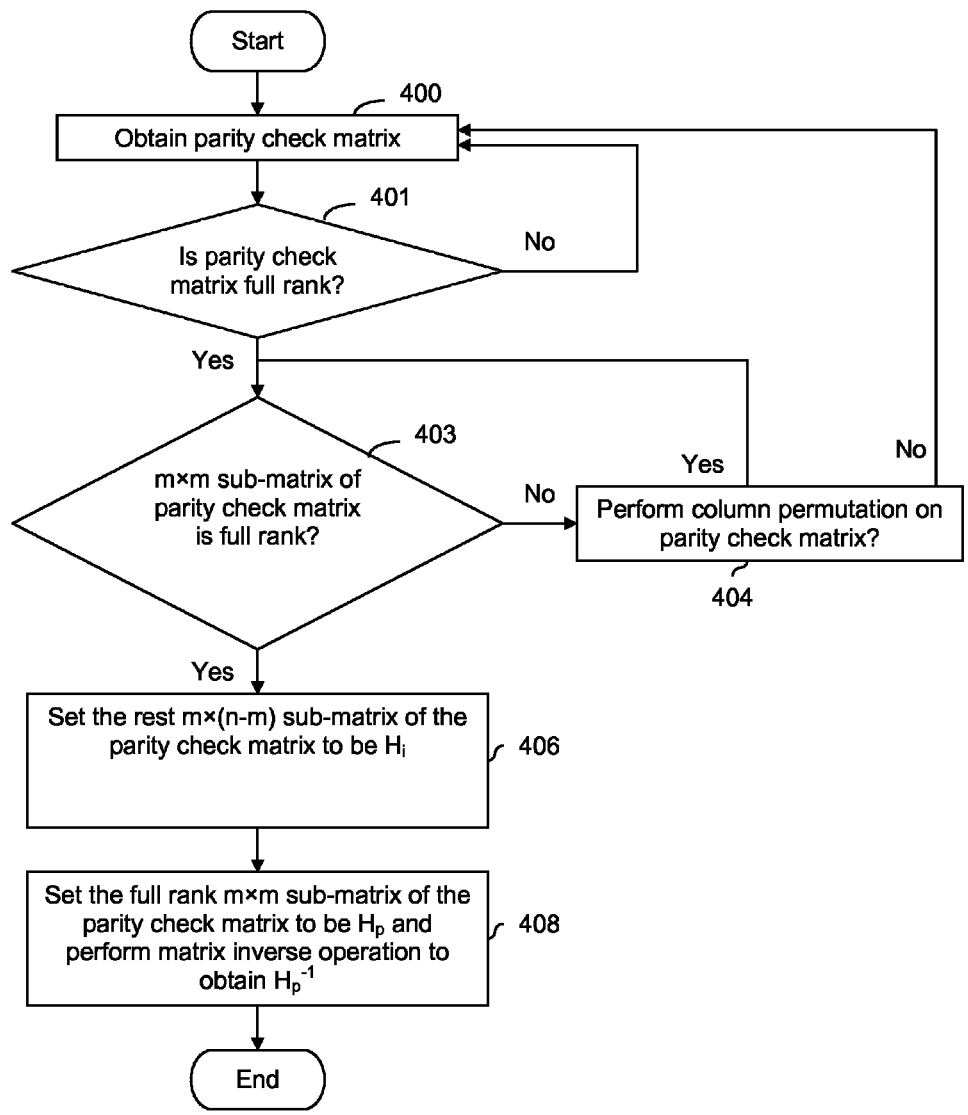
FIG. 4 is a diagram showing an embodiment of a process for obtaining a high density matrix $H_p^{-1}$ and low density sub-matrix $H_i$ of a parity check matrix.

FIG. 4 is a diagram showing an embodiment of a process for obtaining a high density matrix $H_p^{-1}$ and low density sub-matrix of a parity check matrix. At 400, a parity check matrix is obtained. At 401, it is determined if the parity check matrix is a full rank matrix. In this embodiment, the parity check matrix is expected to be a full rank matrix (since without a full rank constraint, the inversion operation is not always possible for $H_p$). If the parity check matrix (H) is not a full rank matrix then a new parity check matrix is obtained at 400.

If the parity check matrix is a full rank matrix then it is determined at 403 if a m×m sub-matrix of a parity check matrix is full rank (to ensure inversion is possible). In such embodiments, the determination at 403 includes determining whether the m columns and m rows on the right (or left) hand side of the parity check matrix comprise a full rank matrix.

If the m×m sub-matrix on the right hand of the parity check matrix is not a full rank matrix, a permutation is performed on the parity check matrix at 404. For example, in case QC-LDPC code, two circulant-columns (circulant-column refers to a column of circulants, permutation in unit of circulant-column can help to maintain the QC structure) switch with each other. The process of performing a permutation on the parity check matrix is repeated at 404 until it is determined at 403 that the m×m sub-matrix on the right hand of the parity check matrix is a full rank matrix. Otherwise, a new parity check matrix is obtained at 400.

Once the m×m sub-matrix on the right hand of the parity check matrix is a full rank matrix, the low density sub-matrix on the left hand of the parity check matrix is set to $H_i$ at 406. In some embodiments, the low density sub-matrix comprises the m rows and (n−m) columns on the left hand side of the parity check matrix and that part of the parity matrix (which includes any necessary permutations applied) is selected to be $H_i$. At 408, the m×m sub-matrix on the right hand of the parity check matrix is inversed to get a high density matrix $H_p^{-1}$. For example, the m columns and m rows on the right hand side of the parity check matrix (including any permutations) is selected to be $H_p$ and a matrix inverse operation is performed on $H_p$.

In various embodiments, the permutations performed on a parity check matrix at 404 are not limited to a unique combination or sequence of permutations. As a result, the sub-matrix $H_i$ and $H_p/H_p^{-1}$ obtained at 406 and 408, respectively, may result in multiple solutions as opposed to a unique solution (i.e., even if the same parity check matrix is input to the process different results may occur). Although there may be more than one result to the process shown, the strength of the code and the properness of the resulting encoding using the obtained sub-matrix $H_i$ and matrix $H_p^{-1}$ are not compromised. Any different sub-matrices of the parity check matrix which result may produce different parity data, but the coding strength and properness of the encoding remains the same.

In some embodiments, the process described above is performed a priori and the resulting matrix $H_p^{-1}$ and sub-matrix $H_i$ are programmed into and stored by a storage system (e.g., that shown in FIG. 1) or an encoder therein (e.g., the encoder shown in FIG. 2A). In some embodiments, a parity check matrix is input to a storage system and the storage system (or an encoder within) performs the processing described above. That is, a process of determining the matrix $H_p^{-1}$ and the sub-matrix $H_i$ may be performed internal to or external to an encoder or a system which includes an encoder.

Figure 5:
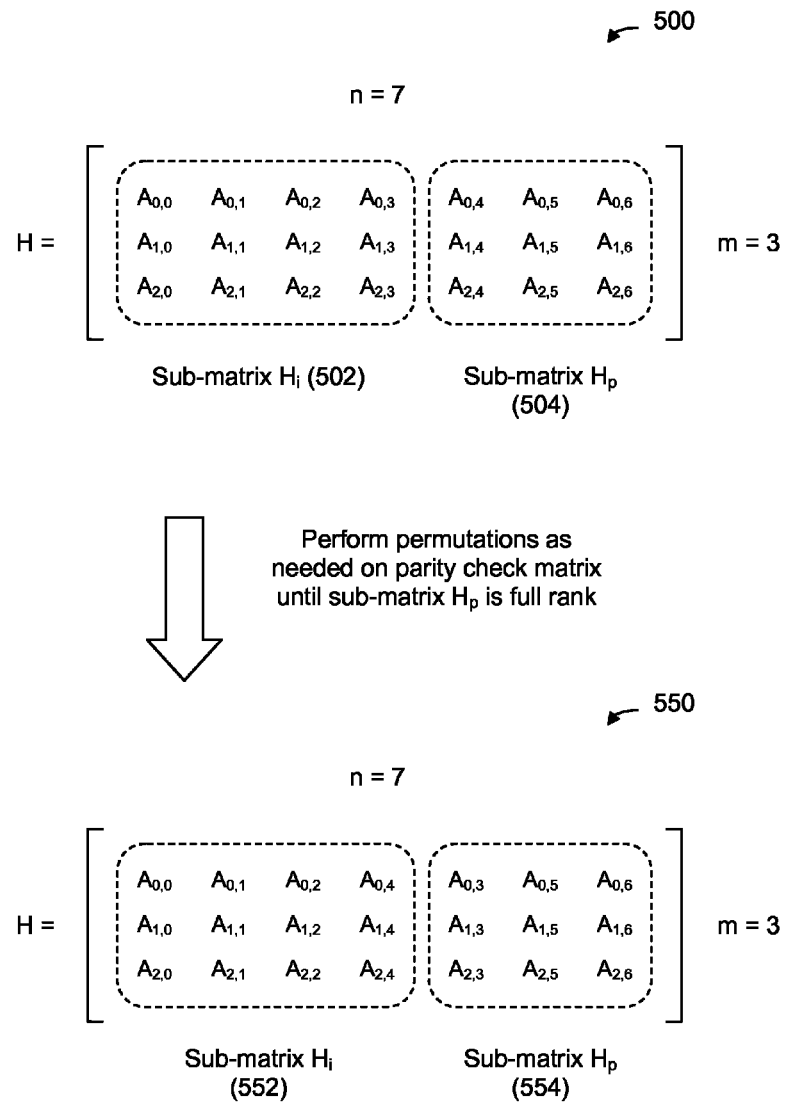
FIG. 5 is a diagram showing an embodiment of a parity check matrix which is processed to produce a matrix $H_p^{-1}$ and the sub-matrix $H_i$.

FIG. 5 is a diagram showing an embodiment of a parity check matrix which is processed to produce a matrix $H_p^{-1}$ and the sub-matrix $H_i$. The process shown in FIG. 4 will be explained using parity check matrix 500 as an example.

Parity check matrix 500 is a 3×7 matrix. Sub-matrix $H_i$ 502 in this example comprises the space occupied by the 3 rows and 4 columns on the left hand side of parity check matrix 500 and the space occupied by the 3 columns and 3 rows on the right hand side of parity check matrix 500 comprise sub-matrix $H_p$ 504.

It is determined if the sub-matrix $H_p$ 504 is a full rank matrix. For example, this includes checking that all rows are independent of all other rows. In this example, the rows of parity check matrix 500 are $A_{0,4}$-$A_{0,6}$, $A_{1,4}$-$A_{1,6}$ and $A_{2,4}$-$A_{2,6}$.

Permutations are performed on parity check matrix 500 as/if needed until the sub-matrix $H_p$ (504) is a full rank matrix. In one example, if the sub-matrix comprised of $A_{0,4}$-$A_{0,6}$, $A_{1,4}$-$A_{1,6}$ and $A_{2,4}$-$A_{2,6}$ is not full rank, the column(circulant-column in QC-LDPC case) $A_{*,4}$ is switched with column (circulant-column in QC-LDPC case) $A_{*,3}$.

Processed parity check matrix 550 results from the one or more permutations and has the property that the elements located within location 504 comprise a full rank matrix. For example, the sub-matrix comprised of $A_{0,3}$ $A_{0,5}$ $A_{0,6}$, $A_{1,3}$ $A_{1,5}$ $A_{1,6}$ and $A_{2,3}$ $A_{2,5}$ $A_{2,6}$ is full rank. With this condition satisfied, the elements located within location 504 are selected to be sub-matrix ($H_p$) 554 and the elements located in location 502 are selected to be the sub-matrix ($H_i$) 552.

In some embodiments, each element $A_{i,j}$ is itself a matrix. In one example of this, each element $A_{i,j}$ is a matrix which has quasi-cyclic properties and the parity check matrix is a quasi-cyclic low-density parity-check (QC-LDPC) parity check matrix. QC-LDPC codes are a subset of LDPC codes where the parity check matrix (H) has some repetition (e.g., each row is a cyclic shift of the row before it). This regularity or repetition enables smaller storage requirements (e.g., of the parity check matrix) and/or easier encoder implementation compared to some other (e.g., unconstrained) LDPC codes. In some embodiments, the technique described herein uses QC-LDPC codes (e.g., the parity check matrix is a QC-LDPC parity check matrix). Quasi-cyclic property is not, however, a requirement of the technique and in some embodiments non-QC-LDPC codes and/or non-QC-LDPC parity check matrices are used. Non-QC LDPC codes can be seen as a special case of QC-LDPC codes with circulant size of 1. The following figure shows an example of a QC-LPDC parity check matrix.

Figure 6:
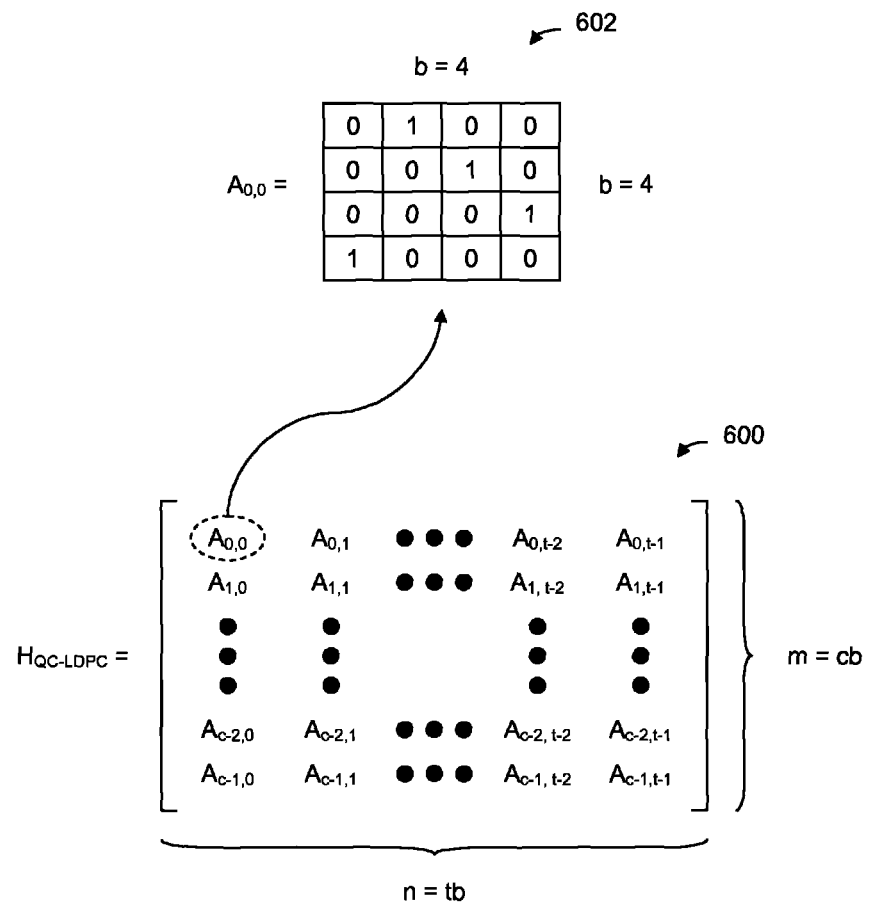
FIG. 6 is a diagram illustrating an embodiment of a QC-LDPC parity check matrix.

FIG. 6 is a diagram illustrating an embodiment of a QC-LDPC parity check matrix. In the example shown, QC-LDPC parity check matrix ($H_{QC\text{-}LDPC}$) is an m×n matrix where both m and n is the product of two integers (i.e., c and b in the case of m and t and b in t. QC-LDPC parity check matrix 600 includes one or more circulants, $A_{i,j}$. A circulant is a square matrix having dimensions b×b where each row is a cyclic shift (e.g., to the right) of the row before it. Circulant 602 shows an example circulant for $A_{0,0}$. In this example, b=4 and each row in circulant 602 is a copy of the previous row which is cyclically shifted one place to the right where values at the end wrap around to the beginning.

Using a parity check matrix which is a QC-LDPC parity check matrix reduces the amount of storage needed to store the matrix $H_p^{-1}$ and the sub-matrix $H_i$ associated with a code. This is because a QC-LDCP parity matrix produces a matrix $H_p^{-1}$ and a sub-matrix $H_i$ for which both matrices have repetition embedded within and less information needs to be stored as a result. The table below shows a comparison of storage requirements for storing a sub-matrix $H_i$ and a matrix $H_p^{-1}$ when beginning with a QC-LDPC parity matrix as opposed to a non-QC-LDPC parity matrix.

TABLE 2

| | Storage Requirements (Bits) | Storage Requirements for QC-LDPC (Bits) |
|---|---|---|
| $H_i$ | m × (n − m) | (m × (n − m))/b |
| $H_p^{-1}$ | m × m | (m × m)/b |

Figure 7:
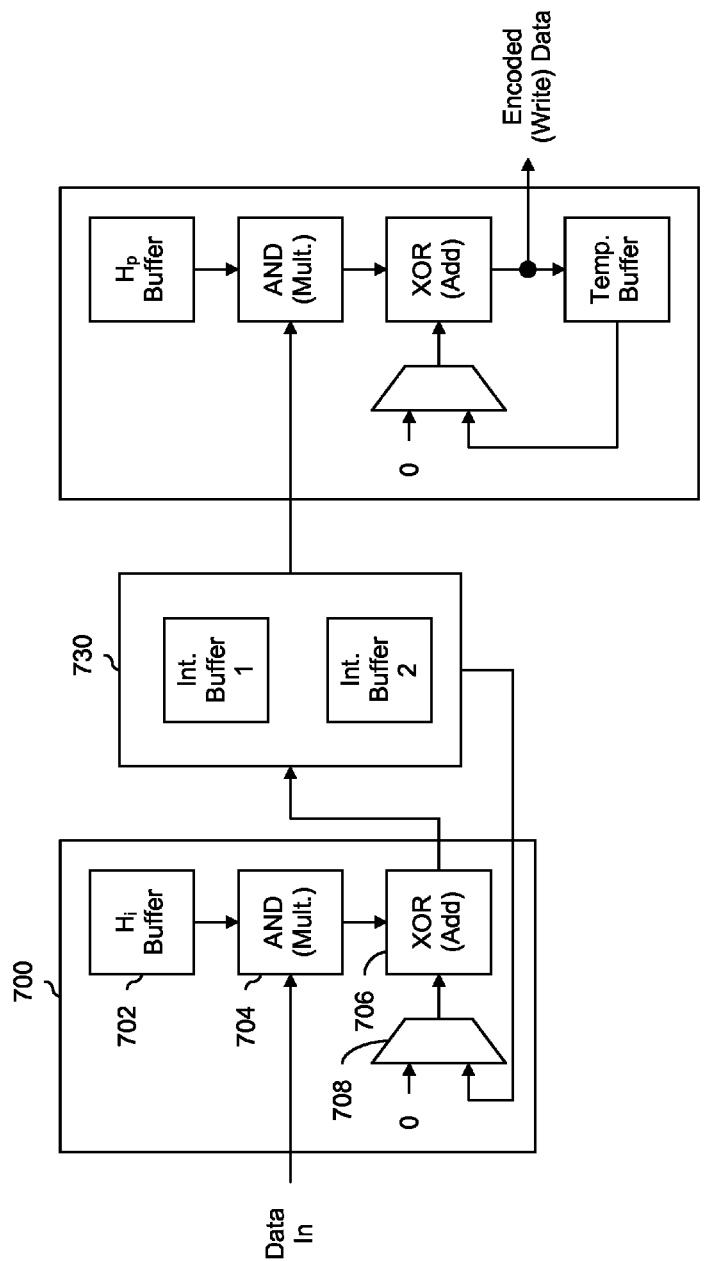
FIG. 7 is a diagram illustrating an embodiment of a two stage LDPC encoder which includes AND gates and XOR (exclusive OR) gates to perform matrix operations.

FIG. 7 is a diagram illustrating an embodiment of a two stage LDPC encoder which includes AND gates and XOR (exclusive OR) gates to perform matrix operations. In some embodiments, first encoding stage 200, intermediate buffer 202 and second encoding stage 204 are implemented as shown.

To illustrate the system shown in FIG. 7, consider the example where the input data u=[$u_0$ $u_1$], the sub-matrix $$H_i = \begin{bmatrix} A'_{0,0} & A'_{0,1} \\ A'_{1,0} & A'_{1,1} \end{bmatrix}$$

and the matrix. The table below shows at various points in time what information exists within first encoding stage 700. The operation performed by the first encoding stage is $t=u*H_i^T$ or $$t = [u_0 u_1] \begin{bmatrix} A'_{0,0} & A'_{1,0} \\ A'_{0,1} & A'_{1,1} \end{bmatrix}.$$

For simplicity, only the processing associated with the first encoding stage 700 is described herein; the operation of the second encoding stage is similar.

TABLE 3

| Data In | Output of $H_i$ Buffer | Output of Multiplexer | Intermediate Data Stored in IB |
|---|---|---|---|
| $u_0$ | $A'_{0,0}$ | 0 | $u_0 \times A'_{0,0}$ |
| $u_0$ | $A'_{1,0}$ | 0 | ($u_0 \times A'_{0,0}$); ($u_0 \times A'_{1,0}$) |
| $u_1$ | $A'_{0,1}$ | $u_0 \times A'_{0,0}$ | ($u_0 \times A'_{0,0} + u_1 \times A'_{0,1}$); ($u_0 \times A'_{1,0}$) |
| $u_1$ | $A'_{1,1}$ | $u_0 \times A'_{1,0}$ | ($u_0 \times A'_{0,0} + u_1 \times A'_{0,1}$); ($u_0 \times A'_{1,0} + u_1 \times A'_{1,1}$) |

As shown in the table above, at a first point in time, first the multiplication $u_0 \times A'_{0,0}$ is performed. Since XOR 706 corresponds to an add (which is not needed at this time), the output of the multiplexer (708) is a 0 which effectively "turns off" the XOR. Adder 706 adds the two inputs passed to it, so having a 0 at one of the inputs of the adder turns it off. The output of buffer 702 is $A'_{0,0}$ which when combined with the data in (i.e., $u_0$) by AND 704 produces the product $u_0 \times A'_{0,0}$.

At a second point in time, a second multiplication of ($u_0 \times A'_{1,0}$) is performed, the result of which is also stored in an intermediate buffer (e.g., one of the buffers in 730). Similar to the previous step, since no addition is being performed, the output of multiplexer is 0 which turns off XOR 706. To perform the multiplication, $A'_{1,0}$ is retrieved from and output by $H_i$ buffer 702 at the same time $u_0$ is at the input.

At a third point in time, a third multiplication of ($u_1 \times A'_{0,1}$) and this product is added to ($u_0 \times A'_{0,0}$) which is stored in the intermediate buffer. Since an addition is being performed at this time, the output of multiplexer 708 is ($u_0 \times A'_{0,0}$) as opposed to a 0 (which would "turn off" the adder). This sum is then stored in the intermediate buffer.

At a fourth point in time, a fourth multiplication of ($u_1 \times A'_{1,1}$) is performed which is added to ($u_0 \times A'_{1,0}$) which is stored in the intermediate buffer. To perform the multiplication, $A'_{1,1}$ is retrieved from and output by $H_i$ buffer 702 at the same time that input $u_i$ is coming in.

Variable-Length Multistage LDPC Encoders and Decoders

FIG. 8 is a diagram showing an embodiment of a QC-LDPC parity check matrix, which includes sub-matrix $H_i$ which comprises columns of circulants. In the example shown, parity check matrix 800 includes sub-matrices 802 and 804. Sub-matrix ($H_i$) 802 is associated with a first-stage of matrix multiplication and sub-matrix ($H_p$) 804 is associated with a second stage of matrix multiplication in a multistage encoder.

Sub-matrix 802 includes columns of circulants 852-858. Depending upon the amount of input data being encoded, varying combinations or numbers of circulant columns 852-858 are used. A circulant column may be referred to more generally as a circulant vectors; another type of circulant vector is a circulant row (i.e., a row of circulants). The table below shows (for the example of FIG. 8) one embodiment of various amounts of input data and corresponding circulant columns to encode that amount of input data.

TABLE 4

| Amount of input data (b = circulant size) | Input data to encode | Sub-matrix to use in first encoding stage |
|---|---|---|
| b | [$u_0 \ldots u_{(b-1)}$] (1 × b matrix) | [$H_{i,3}$]$^T$ (b × 3b matrix) |
| 2b | [$u_0 \ldots u_{(2b-1)}$] (1 × 2b matrix) | [$H_{i,2}$ $H_{i,3}$]$^T$ (2b × 3b matrix) |
| 3b | [$u_0 \ldots u_{(3b-1)}$] (1 × 3b matrix) | [$H_{i,1}$ $H_{i,2}$ $H_{i,3}$]$^T$ (3b × 3b matrix) |
| 4b | [$u_0 \ldots u_{(4b-1)}$] (1 × 4b matrix) | [$H_{i,0}$ $H_{i,1}$ $H_{i,2}$ $H_{i,3}$]$^T$ (4b × 3b matrix) |

So if the amount of input data being processed is b, the first encoding stage is [$u_0 \ldots u_{(b-1)}$]*[$H_{i,3}$]$^T$; for the 2b case the first encoding stage is [$u_0 \ldots u_{(2b-1)}$]*[$H_{i,2}$ $H_{i,3}$]$^T$; for the 3b case the first encoding stage is [$u_0 \ldots u_{(3b-1)}$]*[$H_{i,1}$ $H_{i,2}$ $H_{i,3}$]$^T$; for the 4b case the first encoding stage is [$u_0 \ldots u_{(4b-1)}$]*[$H_{i,0}$ $H_{i,1}$ $H_{i,2}$ $H_{i,3}$]$^T$. All of the amounts of input data (in this example, b, 2b, 3b and 4b) will produce the same sized intermediate data (i.e., a 1×3b matrix) and so no modification to the second stage is necessary.

Table 4 merely shows one embodiment and any sequence or combination of circulant vectors may be used. Some other example sequences for the 2b case include the leftmost circulant columns (e.g., [$H_{i,0}$ $H_{i,1}$]), circulant columns that are not next to each (e.g., [$H_{i,0}$ $H_{i,2}$]) or out-of-order circulant columns (e.g., [$H_{i,2}$ $H_{i,0}$]).

Figure 9:
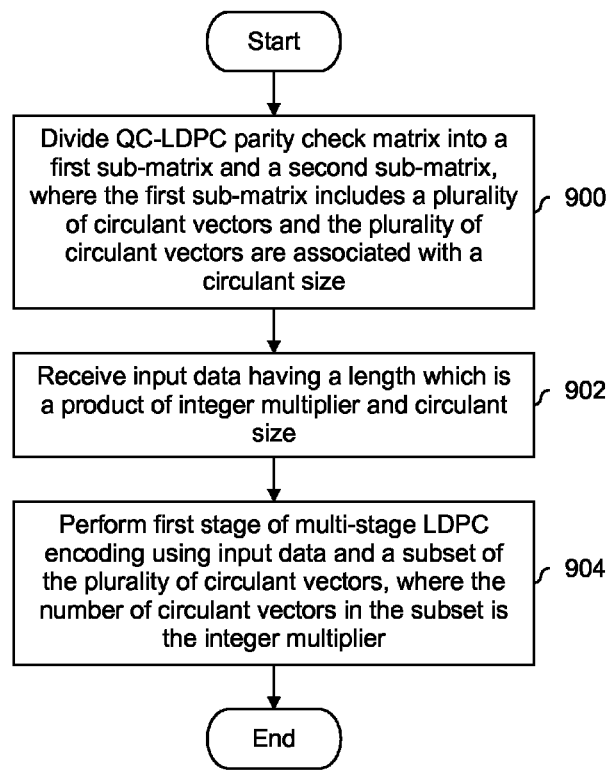
FIG. 9 is a flowchart illustrating an embodiment of a process for encoding varying amounts of input data.

FIG. 9 is a flowchart illustrating an embodiment of a process for encoding varying amounts of input data. In the example shown, the technique permits a multistage encoder to encode different amounts of input data on-the-fly and/or without unloading and loading different codes.

At 900, a QC-LDPC parity check matrix is divided into a first sub-matrix and a second sub-matrix, where the first sub-matrix includes a plurality of circulant vectors and the plurality of circulant vectors is associated with a circulant size. For example, sub-matrix 802 is divided in FIG. 8 into column vectors 852-858, each of which comprises a column of circulants. In some embodiments, at least some of the steps shown in FIG. 4 are used to divide the parity check matrix into a plurality of sub-matrices (e.g., $H_i$ and $H_p$).

Input data is received having a length which is a product of an integer multiplier and a circulant size at 902. For example, in the 3b case shown in the table above, the integer multiplier would be 3. In various embodiments, the value of the integer multiplier is identified in a variety of ways. In some embodiments, an interface (e.g., via which input data to encode is received) is configured to signal the amount of data being exchanged before the data is actually exchanged; the value of the integer multiplier is thus known before the input data is actually received. In such embodiments, a multi-stage encoder may (if desired) be configured with the appropriate number or amount of circulant vectors to use prior to actually receiving the input data and encoding can begin soon after the input data starts being received. In some other embodiments, a multistage coding system does not know ahead of time how much data is to be received (e.g., until an "end of sector" or "end of packet" flag is raised). In such embodiments, a buffer may be used to store the received data and encoding begins once the integer multiplier is determined (e.g., by counting how much data is received and then dividing that amount by the circulant size).

At 904, a first stage of multi-stage LDPC encoding is performed using the input data and a subset of the plurality of circulant vectors, where the number of circulant vectors in the subset is the integer multiplier. For example, the 2b case in the table above uses circulant vectors which are columns (as opposed to rows) and specifically circulant columns $J_{i,2}$ and $H_{i,3}$ are used. The data produced at 904 is the product of a first stage of multi-stage encoding process.

On the decoding side, the same matrix is used to decode the encoded data. In the table above, for example, the input data $[u_0 \ldots u_{(b-1)}]$ having a length of b would be decoded using the circulant column $H_{i,3}$. In some embodiments, input data may have varying lengths and one piece of input data may not necessarily have the same length as a piece of data before or after it. In some embodiments, a table is used to track the amount of input data which was received and/or a specific sequence of circulant vectors to use when decoding a particular piece of encoded data. In one example in the storage space, a write controller stores in such a table what sequence of circulant vectors to use in decoding a particular storage location or sector. When reading back a storage location or sector, the read controller accesses the table and uses to stored information to determine how to properly decode the information stored in that sector or storage location (e.g., what circulant vectors were used to encode it and thus what circulant vectors to use to decode it).

In some embodiments, a system is programmable or configurable and is able to operate using a specified or selected LDPC code. For example, the code may be loaded from an external source and/or the system may include storage for storing codes and when instructed (e.g., by some driver, application or other entity) one of the stored codes is selected and loaded. The following shows an embodiment where such a configurable encoder is able (using the techniques described herein) to load and use LDPC codes where the parity check matrices are both full rank and non-full rank. This may be desirable since it does not limit the set of usable codes to those with full rank parity check matrices.

Figure 10:
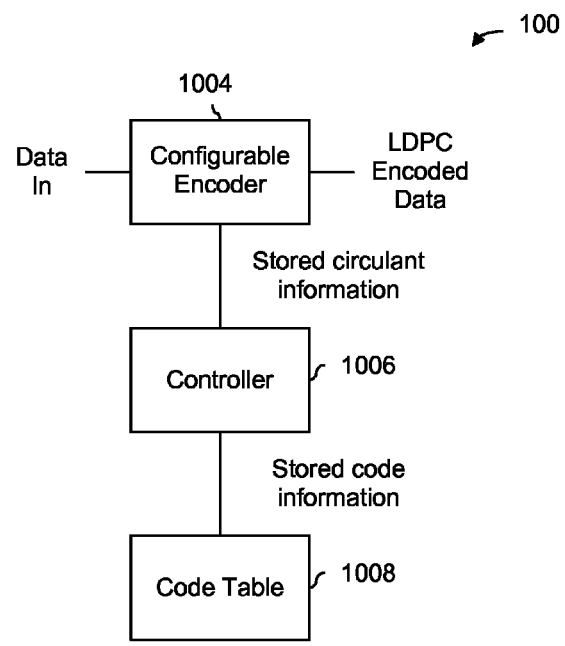
FIG. 10 is a diagram showing an embodiment of a code table and a programmable encoder configured to store and use codes in a storage efficient manner, including those codes with non-full rank parity check matrices.

FIG. 10 is a diagram showing an embodiment of a code table and a programmable encoder configured to store and use codes in a storage efficient manner, including those codes with non-full rank parity check matrices. In some embodiments, LDPC encoder 100 from FIG. 1 is implemented as shown.

Before any data is encoded, controller 1006 configures other components in the system. The programming sequence described herein is merely exemplary and is not necessarily limiting. Controller 1006 receives some indication to load a specified code, for example from some driver, application or other entity. In response to the indication, controller 1006 accesses code table 1008 and accesses the stored code information for the specified code. Using this information, controller 1006 programs configurable encoder 1004 so that the specified code is loaded. In some embodiments, configurable encoder 1004 is a "dumb" device and controller 1006 determines appropriate values for all elements in the parity check matrix and/or generator matrix (e.g., from some smaller building block(s) stored in code table 1008) and provides or otherwise programs configurable encoder 1004 with all of those values, e.g., fully populating some matrix space within configurable encoder 1004. In some other embodiments, configurable encoder 1004 includes some intelligence and once provided the building block(s) from controller 1006 is able to determine the entire matrix (e.g., configurable encoder 1004 knows there is some repeatable pattern in the generator matrix and/or parity check matrix and populates at least some of the values in its internal matrix space with appropriate values).

In this example, the components know beforehand the values of n and m; in some other embodiments the values of n and/or m are configurable and controller 1006 programs appropriate components with the values of n and/or m if needed.

Once controller 1006 has completed programming appropriate components, encoding begins. Using the generator or parity check matrix loaded into it, configurable encoder 1004 encodes the input data passed to it and outputs LDPC encoded data. The LDPC encoded data may be further processed and subsequently stored in storage media or transmitted over a communications channel.

The bottom portion of FIG. 10 shows an embodiment of a code table. In the example shown, each code is assigned a unique code ID (see column 1050) and in some embodiments, a driver or application provides controller 1006 with the unique code ID of a desired code when specifying or selecting a code. Code space 1054 is used to store information used to reconstruct or regenerate a parity check matrix and/or generator matrix associated with a particular code. In some embodiments, a row vector or column vector from one or more circulants associated with a matrix are stored in code space 1054.

Storing the Generator Matrix and/or the Parity Check Matrix

Some systems are configured to store the generator matrix and/or the parity check matrix. For example, a system may store a plurality of matrix pairs, each of which is associated with a different data rate, different error correction capabilities, etc. A user or driver may configure the system to load a specified matrix pair and encode/decode information using the loaded matrix pair. Such a system may be more attractive than a system with a single, hardcoded matrix pair since it offers flexibility and/or multiple modes of operation. In another example, a system is initially "blank" and a user or driver loads a matrix pair into the system where it is stored. For example, some end users may prefer to use a specific LDPC code and/or not have other people (including a storage or communication systems manufacture) know what code is being used. The following figures are used to describe some techniques for storing a generator matrix and/or a parity check matrix in an efficient manner.

Figure 11:
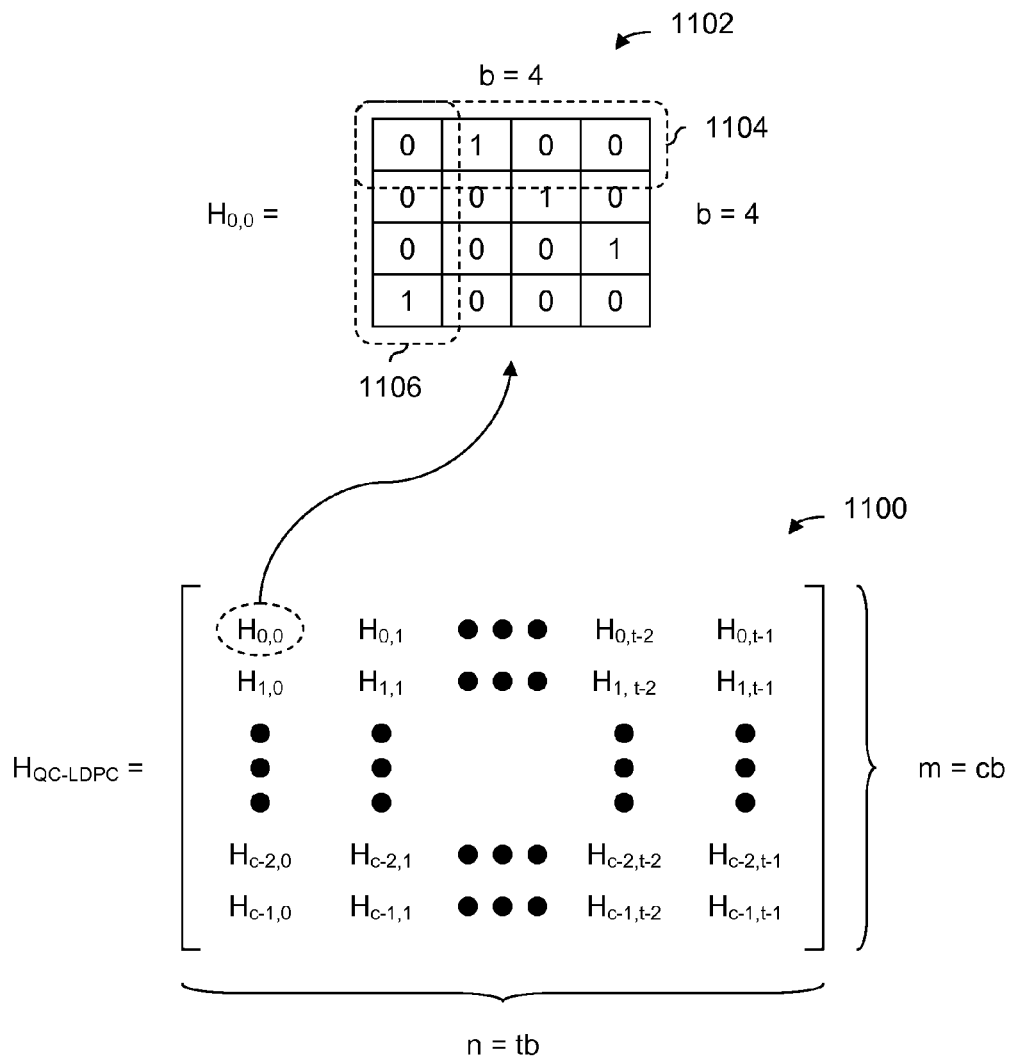
FIG. 11 is a diagram showing an embodiment of a QC-LDPC parity check matrix.

FIG. 11 is a diagram showing an embodiment of a QC-LDPC parity check matrix. In the example shown, QC-LDPC parity check matrix 1100 includes a plurality of circulants. One of the circulants, $H_{0,0}$ (1102), is shown and has a circulant size of b=4 in this example. Circulant 1102 includes a plurality of vectors, including row vector 1104 and column vector 1106.

Figure 12:
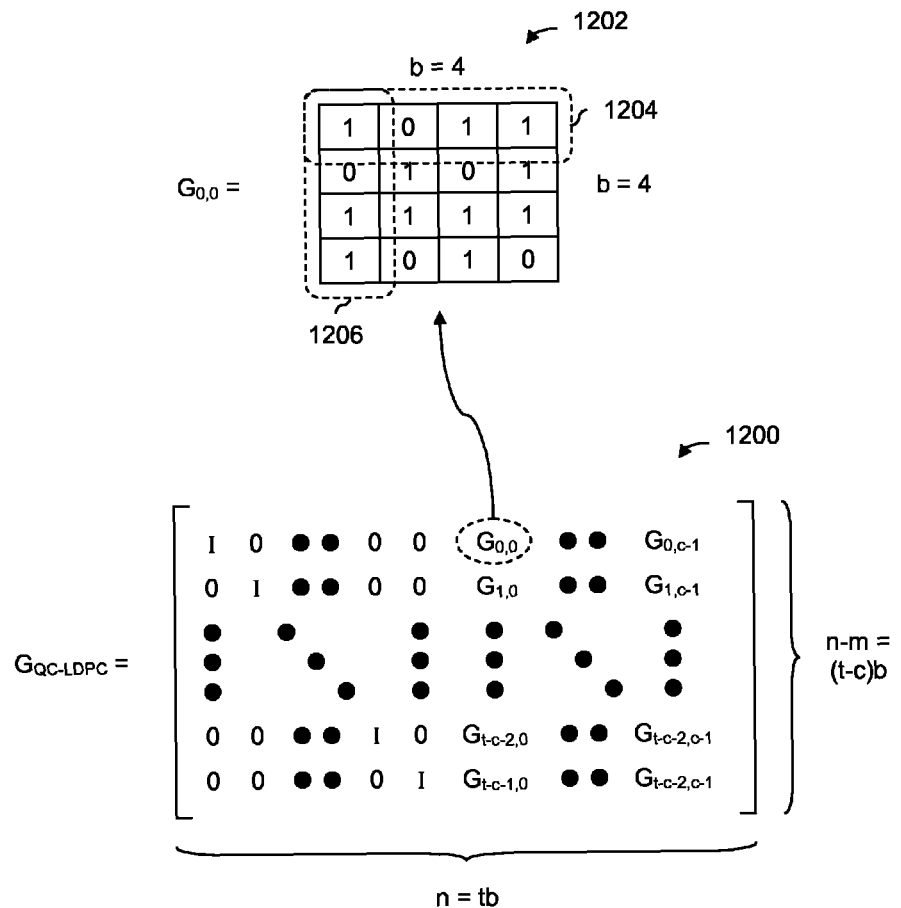
FIG. 12 is a diagram showing an embodiment of a QC-LDPC generator matrix.

FIG. 12 is a diagram showing an embodiment of a QC-LDPC generator matrix. In the example shown, QC-LDPC generator matrix 1200 includes a plurality of circulants; circulant $G_{0,0}$ (1202) is shown with an example circulant size of b=4. A plurality of vectors make up circulant 1202, including row vector 1204 and column vector 1206.

Oftentimes LDPC parity check matrices (which include QC-LDPC parity check matrices) are low density matrices. Put another way, the number of 1's in a LPDC parity check matrix tends to be low. In contrast, an LDPC generator matrix typically is not low density and has a more 1's compared to the parity check matrix.

In some embodiments, for a given one of the circulants (e.g., associated with a parity check matrix or a generator matrix), one and only one vector from that circulant is stored. For example, for parity check matrix 1102, the only information stored for that circulant is row vector 1104. Or, for generator matrix 1202, the only information stored for that circulant is column vector 1206. In some embodiments, a single vector is stored for each circulant (e.g., a first vector from circulant $G_{0,0}$ is stored, a second vector from $G_{0,1}$ is stored, etc.).

In some embodiments, storing the parity check matrix includes storing, for at least one of the plurality of circulants, the location(s) of the 1's in one vector. For example, for circulant 1104 associated with QC-LDPC parity check matrix 1100, column vector 1106 is stored (from which circulant 1104 can be reconstructed). In some embodiments, storing the location is more storage efficient for low density matrices. As a result, in some embodiments, the technique of storing a location is used for storing information associated with parity check matrices but not necessarily for generator matrices which tend to have higher densities. In some embodiments, if the number of 1's in a circulant (e.g., one of circulants $H_{i,j}$) is less than $b/(ceil(log_2(b)))$, where b is the circulant size, then the location of 1's is stored. In some embodiments, this threshold is based on the assumption that the locations are stored in base 2 format.

In some embodiments, when there is relatively small number of 1's (e.g., in a row vector of the circulant), a non-base 2 format is used to store the location of the 1's. In one example, if the circulant size (i.e., b) is 12 then the valid locations of 1's would be (in decimal) 1 (i.e., there is a 1 in the first element of the vector), 2 (i.e., there is a 1 in the second element of the vector), . . . , 11 and 12. In binary (i.e., base 2), this would be 0001, 0010, . . . , 1011, and 1100. An example of a non-base 2 format is [6 3 2 1] which results in all 16 combinations of 0000 thru 1111 being mapped to 0 thru 12 (in decimal) when this [6 3 2 1] format is used. In some cases this is a many to one mapping (e.g., both 0100 and 0011 in this format will map to 3 in decimal). One benefit to using a non-base 2 format to store locations is a more efficient hardware design (e.g., when implemented as a field-programmable gate array (FPGA) or application-specific integrated circuit (ASIC)). For example, addressing the memory is made easier and there is less routing congestion. Another advantage is that a non-base 2 format can be used to avoid some or all out-of-bounds addresses. In the [6 3 2 1] example above, it is impossible to map to 13-15 in decimal and thus those out-of-bounds addresses (for this example where the circulant size b=12) cannot be accidentally accessed. In some embodiments, 0000 (e.g., in base 2 format or some non-base 2 format such as [6 3 2 1]) represents a special value: an all zero matrix or vector.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for encoding, comprising:
    a processor configured to divide a quasi-cyclic low-density parity-check (QC-LDPC) parity check matrix into a first sub-matrix and a second sub-matrix, wherein the first sub-matrix includes a plurality of circulant vectors and the plurality of circulant vectors is associated with a circulant size;
    an interface configured to receive input data having a length which is a product of an integer multiplier and the circulant size; and
    an encoder configured to perform a first stage of multi-stage LDPC encoding using the input data and a subset of the plurality of circulant vectors, wherein the number of circulant vectors in the subset equals the integer multiplier.

2. The system recited in claim 1, wherein the encoder generates LDPC encoded data and the system further includes storage configured to store the LDPC encoded data.

3. The system recited in claim 2, wherein the storage includes one or more of the following: magnetic disk storage or Flash storage.

4. The system recited in claim 1, wherein the plurality of circulant vectors includes at least one column of circulants.

5. The system recited in claim 1, wherein the subset only includes circulant vectors which are contiguous to each other within the first sub-matrix.

6. The system recited in claim 1, wherein the interface is further configured to obtain the integer multiplier, including by counting the length of the input data.

7. The system recited in claim 1 further comprising:
    storage configured to store information associated with a plurality of QC-LDPC codes; and
    a controller configured to:
        receive a selection of one of the plurality of QC-LDPC codes; and
        in response to receiving the selection: retrieve information stored in the storage associated with the selected one of the plurality of QC-LDPC codes and program the encoder with at least some of the retrieved information.

8. The system recited in claim 1, wherein:
    the parity check matrix is associated with a generator matrix which includes a plurality of circulants; and
    the system further includes storage configured to store the generator matrix by storing, for at least one of the plurality of circulants, one and only one vector from said at least one of the plurality of circulants.

9. The system recited in claim 1, wherein:
    the parity check matrix includes a plurality of circulants; and
    the system further includes storage configured to store the parity check matrix by storing, for at least one of the plurality of circulants, one and only one vector from said at least one of the plurality of circulants.

10. The system recited in claim 1, wherein:
    the parity check matrix includes a plurality of circulants; and
    the system further includes storage configured to store the parity check matrix by storing, for at least one of the plurality of circulants, the location(s) of the 1's in one and only one vector from said at least one of the plurality of circulants.

11. The system recited in claim 10, wherein: storing the location(s) of the 1's is performed in the event the number of 1's in the parity check matrix is less than $b/(\text{ceil}(\log_2(b)))$ where b is the circulant size.

12. The system recited in claim 10, wherein storing the location(s) of the 1's includes storing the location(s) in non base 2.

13. A method for encoding, comprising:
using a processor to divide a quasi-cyclic low-density parity-check (QC-LDPC) parity check matrix into a first sub-matrix and a second sub-matrix, wherein the first sub-matrix includes a plurality of circulant vectors and the plurality of circulant vectors is associated with a circulant size;
receiving input data having a length which is a product of an integer multiplier and the circulant size; and
performing a first stage of multi-stage LDPC encoding using the input data and a subset of the plurality of circulant vectors, wherein the number of circulant vectors in the subset equals the integer multiplier.

14. The method recited in claim 13, wherein encoding generates LDPC encoded data and the method further includes storage configured to store the LDPC encoded data.

15. The method recited in claim 14, wherein the storage includes one or more of the following: magnetic disk storage or Flash storage.

16. The method recited in claim 13, wherein the plurality of circulant vectors includes at least one column of circulants.

17. The method recited in claim 13, wherein the subset only includes circulant vectors which are contiguous to each other within the first sub-matrix.

18. The method recited in claim 13, further comprising obtaining the integer multiplier, including by counting the length of the input data.

19. The method recited in claim 13 further comprising:
storing information associated with a plurality of QC-LDPC codes; and
receiving a selection of one of the plurality of QC-LDPC codes; and
in response to receiving the selection: retrieving stored information associated with the selected one of the plurality of QC-LDPC codes and programming an encoder, which performs first stage of multi-stage LDPC encoding, with at least some of the retrieved information.

20. The method recited in claim 13, wherein:
the parity check matrix is associated with a generator matrix which includes a plurality of circulants; and
the method further includes storing the generator matrix by storing, for at least one of the plurality of circulants, one and only one vector from said at least one of the plurality of circulants.

21. The method recited in claim 13, wherein:
the parity check matrix includes a plurality of circulants; and
the method further includes storing the parity check matrix by storing, for at least one of the plurality of circulants, one and only one vector from said at least one of the plurality of circulants.

22. The method recited in claim 13, wherein:
the parity check matrix includes a plurality of circulants; and
the method further includes storing the parity check matrix by storing, for at least one of the plurality of circulants, the location(s) of the 1's in one and only one vector from said at least one of the plurality of circulants.

23. The method recited in claim 22, wherein: storing the location(s) of the 1's is performed in the event the number of 1's in the parity check matrix is less than $b/(\text{ceil}(\log_2(b)))$ where b is the circulant size.

24. The method recited in claim 22, wherein storing the location(s) of the 1's includes storing the location(s) in non base 2.

* * * * *